United States Patent
Chen et al.

(10) Patent No.: US 11,276,435 B2
(45) Date of Patent: Mar. 15, 2022

(54) VIBRATION ISOLATION APPARATUS FOR SERVER RACK DELIVERY

(71) Applicant: QUANTA COMPUTER INC., Taoyuan (TW)

(72) Inventors: Chao-Jung Chen, Taoyuan (TW); Ming-Sheng Chang, Taoyuan (TW); Po-Yu Yang, Taoyuan (TW); Sheng-Wei Tang, Taoyuan (TW)

(73) Assignee: QUANTA COMPUTER INC., Taoyuan (TW)

(*) Notice: Subject to any disclaimer, the term of this patent is extended or adjusted under 35 U.S.C. 154(b) by 502 days.

(21) Appl. No.: 16/175,134

(22) Filed: Oct. 30, 2018

(65) Prior Publication Data
US 2020/0135239 A1 Apr. 30, 2020

(51) Int. Cl.
*G11B 33/08* (2006.01)
*G06F 1/16* (2006.01)
(Continued)

(52) U.S. Cl.
CPC ........... *G11B 33/08* (2013.01); *G06F 1/1601* (2013.01); *H05K 5/0004* (2013.01);
(Continued)

(58) Field of Classification Search
CPC ..... G11B 33/08; G06F 1/1601; G06F 1/1658; H05K 5/0004; H05K 5/0217; H05K 7/1495; B65D 81/05; B65D 81/053; B65D 81/054; B65D 81/055; B65D 81/056
USPC ....... 248/686, 576, 568, 580, 583, 605, 610, 248/611, 613, 634, 636, 638; 361/724, 361/735, 810, 825; 206/521, 583, 586, 206/591, 592
See application file for complete search history.

(56) References Cited

U.S. PATENT DOCUMENTS

| 4,013,170 A | * | 3/1977 | Hutterer | ................ B65D 81/07 |
| | | | | 206/521 |
| 4,063,702 A | * | 12/1977 | Wilde | ................. A47B 95/043 |
| | | | | 248/345.1 |

(Continued)

FOREIGN PATENT DOCUMENTS

| JP | 2009269649 A | 11/2009 |
| JP | 2019078300 A | 5/2019 |

OTHER PUBLICATIONS

JP Office Action for Application No. 2019-165959, dated Aug. 25, 2020, w/ First Office Action Summary.

*Primary Examiner* — Eret C McNichols
*Assistant Examiner* — Michael McDuffie
(74) *Attorney, Agent, or Firm* — Nixon Peabody LLP

(57) ABSTRACT

A shock absorber apparatus is provided. The shock absorber apparatus includes an elastic device and at least one mounting device connected to the elastic device. Each mounting device includes two securing elements. Each securing element is configured to secure an opposing portion of a structure. Each mounting device can also include two sliders. Each slider can have at least two surfaces, which are interconnected by an inclined surface facing an opposing slider, and a ground surface. The inclined surface can be slidably connected to one of the at least two securing elements. Each slider can be arranged to move in response to an applied force. The ground surface is configured to slidably connect to an inner wall of a box.

18 Claims, 5 Drawing Sheets

(51) Int. Cl.
*H05K 5/00* (2006.01)
*H05K 5/02* (2006.01)
*H05K 7/14* (2006.01)

(52) U.S. Cl.
CPC ......... *H05K 5/0217* (2013.01); *H05K 7/1495* (2013.01); *G06F 1/1658* (2013.01)

(56) References Cited

U.S. PATENT DOCUMENTS

| | | | | |
|---|---|---|---|---|
| 4,574,955 A * | 3/1986 | Camossi | ................ | B65D 81/07 206/386 |
| 5,538,155 A * | 7/1996 | Hoekstra | ............ | B65D 88/1631 220/495.01 |
| 5,653,070 A * | 8/1997 | Seguin | .................... | F16F 15/02 52/167.1 |
| 5,655,662 A * | 8/1997 | Garcia | .................. | B65D 81/07 206/583 |
| 5,823,348 A * | 10/1998 | Phillips | ................. | B65D 81/07 206/583 |
| 6,247,594 B1 * | 6/2001 | Garton | .................. | B65D 19/04 206/512 |
| 6,371,434 B1 * | 4/2002 | Becker | .................... | F16F 15/04 248/610 |
| 6,567,265 B1 * | 5/2003 | Yamamura | ............ | G11B 33/08 206/523 |
| 6,671,124 B2 * | 12/2003 | Guion | .................... | G11B 33/08 248/603 |
| 7,516,597 B1 * | 4/2009 | Roose | .................... | B65B 55/20 53/139.5 |
| 8,967,392 B1 * | 3/2015 | Czamara | ............. | H05K 7/1489 211/26 |
| 8,991,780 B2 * | 3/2015 | Pedersen | ................. | B66C 1/10 248/562 |
| 9,485,885 B2 * | 11/2016 | Czamara | ................ | F16M 13/00 |
| 9,738,429 B2 * | 8/2017 | Buelna | .................. | B65D 81/07 |
| 10,252,833 B2 * | 4/2019 | Hao | .................... | B65D 81/127 |
| 10,724,599 B2 * | 7/2020 | Embleton | ............... | F16F 7/104 |
| 10,850,757 B1 * | 12/2020 | Curlee | ................ | B62B 3/004 |
| 2003/0015639 A1 * | 1/2003 | Smith | .................... | G11B 33/08 248/345.1 |
| 2003/0179544 A1 * | 9/2003 | Bruner | ................ | G11B 25/043 361/679.33 |
| 2003/0210519 A1 * | 11/2003 | Wubs | .................... | G11B 33/08 361/679.35 |
| 2009/0138900 A1 * | 5/2009 | Wu | ....................... | G11B 5/5582 720/651 |
| 2013/0181107 A1 * | 7/2013 | Stansbury | ................ | A61P 3/04 248/638 |
| 2014/0111933 A1 * | 4/2014 | Knopf | ....................... | G06F 1/20 361/679.34 |
| 2015/0053841 A1 * | 2/2015 | Terajima | ................. | G02B 7/08 248/638 |
| 2016/0348751 A1 | 12/2016 | Cho et al. | | |
| 2017/0322602 A1 * | 11/2017 | Tan | ........................ | F16F 15/06 |
| 2019/0383351 A1 * | 12/2019 | Forgacs | ................ | F16F 15/022 |

* cited by examiner

VIBRATION ISOLATION APPARATUS FOR SERVER RACK DELIVERY

FIELD OF THE INVENTION

The present disclosure relates generally to information handling systems, and more particularly to a delivery system for racks that hold information handling systems.

BACKGROUND

Servers, networking devices, storage systems, and other devices known in the art are sometimes used in racks. Each rack can house multiple devices coupled to each other as well as devices in other racks. Some of those racks are relatively tall to enable the rack to house a relatively large number of devices. For example, conventional 42 unit (42U) racks may measure up to 7 feet tall, and other rack types can exceed that height. The shipping and delivery of such racks can raise a number of issues. Conventional rack delivery systems typically involve rigidly mounting the rack to a shipping pallet (e.g., via brackets secured to the shipping pallet and bottom of the rack) that provides a wider base than the rack, and increases the tip angle of the rack to reduce the chances of the rack tipping-over during shipping and delivery.

However, in addition to tipping-over, other concerns arise during rack shipping and delivery. For example, racks may be subject to external forces during shipping and delivery that can damage the rack and/or components in the rack. Such damage can be expensive as racks may be shipped and delivered with equipment valued up to several million dollars. Conventional solutions for dealing with such forces during rack delivery and shipping have included the use of foam as a layer in the shipping pallet (sometimes referred to as a "shock pallet"). The foam is configured to absorb vertical forces that may be induced during delivery (e.g., in a truck or other delivery vehicle) and transmitted to the shipping pallet. However, it has been found that racks can experience significant horizontal motion that can provide damaging forces on the rack as well. For example, forces induced by the rack delivery vehicle during rack shipping and delivery are typically transmitted to the bottom portion of the rack (e.g., at the mounting location to the shipping pallet), and have been found to introduce significant horizontal motion at the unconstrained top portion of the rack. This can result in the bending of structural members in the rack, seizing of rack casters, and in extreme cases, rack component damage. Accordingly, it would be desirable to provide an improved rack delivery system.

SUMMARY

The following is a simplified summary of one or more embodiments in order to provide a basic understanding of present technology. This summary is not an extensive overview of all contemplated embodiments of the present technology. It is intended neither to identify key or critical elements of all examples, nor to delineate the scope of any or all aspects of the present technology. Its sole purpose is to present some concepts of one or more examples in a simplified form as a prelude to the more detailed description that is presented later.

The present disclosure provides a shock and vibration absorber system which includes an elastic device and a mounting device. The mounting device can be connected to the elastic device. The mounting device can include at least two securing elements and at least two sliders. Each securing element can be configured to secure opposing portions of a structure. Each slider can have at least two corresponding surfaces which are interconnected by at least one inclined surface and at least one ground surface. The inclined surface can be facing an opposing slider and slidably connected to one of the securing elements. Each slider can be further arranged to move in response to an applied force. Each slider can be configured to slidably connect to an inner wall within a box.

In some embodiments, the securing element can be positioned between two stoppers on the inclined surface to restrict movement of the securing element in response to an applied force. In some embodiments, each of the securing elements can include at least one bearing configured to connect one of the inclined surfaces to a corresponding securing element. In some embodiments, each of the ground surfaces can include at least one bearing. Each bearing can be configured to connect each slider to the inner wall. A first end of the elastic device can be connected to a first slider of the at least two sliders. A second end of the elastic device is connected to a second of the at least two sliders. In some embodiments, a first end of the elastic device can be connected to a first of the at least two sliders. A second end of the elastic device can be connected to the inner wall. In some embodiments, the system can also include a first mounting device connected to a top frame of the box and a second mounting device connected to a bottom frame of the box. In some embodiments, the elastic device can also include a spring device.

In some exemplary embodiments, the securing elements can secure opposing portions which are substantially aligned with each other along at least one axis. In some embodiments, each slider can be connected to a corresponding securing element at a spring-biased pivot element.

The present disclosure also provides a delivery system implementing the shock and vibration absorption system. The delivery system can include a container structure, a device, and at least two mounting devices. The container structure includes a top inner surface and a bottom inner surface. The rack device includes a top frame and a bottom frame. Each mounting device includes at least two securing elements and at least two sliders. Each securing element is configured to secure opposing portions of the device. Each slider can have at least two surfaces which are interconnected by an inclined surface facing an opposing slider. The inclined surface can be slidably connected to one of the at least two securing elements. Each slider can be further arranged to move in a direction perpendicular to an applied force and in an opposing direction from the opposing slider. Each slider can be configured to slidably connect to an inner wall within a box.

Additional features and advantages of the disclosure will be set forth in the description that follows, and in part, will be obvious from the description, or can be learned by practice of the principles disclosed herein. The features and advantages of the disclosure can be realized and obtained by means of the instruments and combinations particularly pointed out in the appended claims. These and other features of the disclosure will become fully apparent from the following description and appended claims, or can be learned by the practice of the principles set forth herein.

BRIEF DESCRIPTION OF THE DRAWINGS

In order to describe the manner in which the above-recited disclosure and its advantages and features can be obtained, a more particular description of the principles described above will be rendered by reference to specific examples illustrated in the appended drawings. These drawings depict only example aspects of the disclosure, and are therefore not to be considered as limiting of its scope. These principles are described and explained with additional specificity and detail through the use of the following drawings.

DETAILED DESCRIPTION

Figure 1:
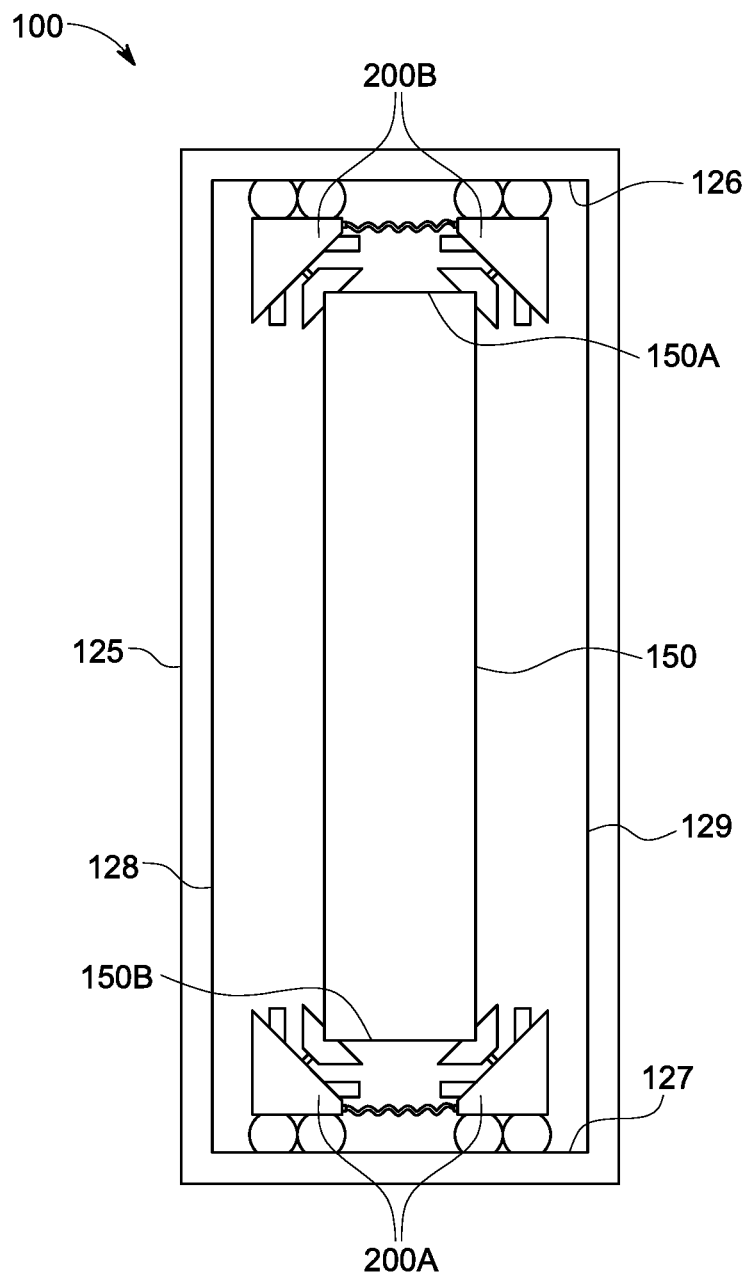
FIG. 1 illustrates a cut-away view of a delivery system, in accordance with an implementation of the present disclosure.

The present invention is described with reference to the attached figures, where like reference numerals are used throughout the figures to designate similar or equivalent elements. The figures are not drawn to scale, and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

As discussed above, there is significant interest in providing a delivery system for racks that rack devices, in particular, a delivery system that isolates vibration in both vertical and horizontal directions. The disclosed system can decrease the cost of manufacturing and shipping by eliminating the need for a rack reinforcement structure. Furthermore, the disclosed system can simplify the packing process. In some embodiments, the delivery system can include two slider spring apparatuses. Each slider spring apparatus can be connected to a rack system at its short edge. Each slider spring apparatus can include two securing elements and two sliders. The sliders can be connected to one another by a spring. Each securing element can be configured to secure opposing portions of the rack system along the short edge. The securing element can be connected to the slider, and positioned between two stoppers on the slider. Each slider can include bearings configured to contact inner walls within a container. Each slider spring apparatus redistribute vertical force as a normal force and a friction force. The friction force is transformed to a relative displacement between the container and rack. The relative displacement being the reduced-friction contact between the bearings and the inner walls of the container. This eliminates the direct and complete transfer of vertical force applied on the delivery system to the information handling system. The slider spring apparatuses can reduce horizontal vibration as well.

FIG. 1 illustrates a cut-away view of a delivery system 100 of an exemplary embodiment. The delivery system 100 may be one of a multitude of container systems for housing rack servers during shipment. The delivery system 100 can include a container 125. For example, the container 125 can be a wooden crate or box system configured to house an information handling system during the shipment process. The container 125 can include a top inner surface 126, a bottom inner surface 127, a left inner wall 128, and right inner wall 129. The delivery system 100 can also include a rack device 150. The rack device 150 can be a standard rack configured to be installed in a data center. The rack device 150 can include pre-installed information technology components.

Figure 2:
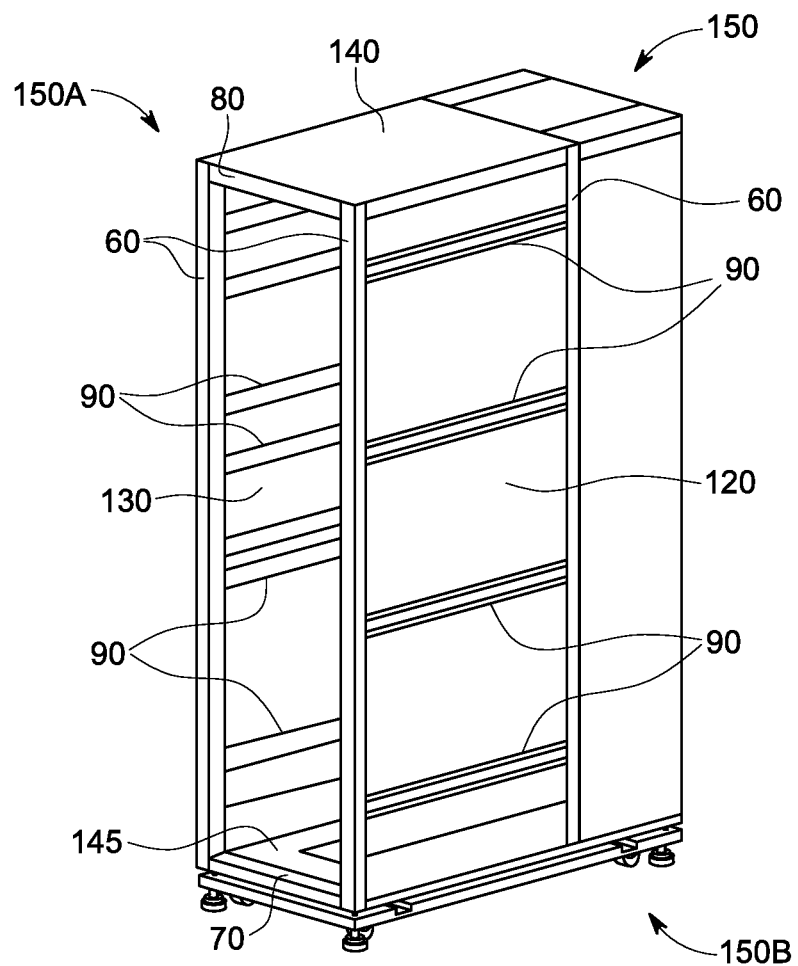
FIG. 2 illustrates a rack device housed within the delivery system of FIG. 1, in accordance with an implementation of the present disclosure.

Referring momentarily to FIG. 2, the rack device 150 can include front-to-back beams 90, top side-to-side beams 80, bottom side-to-side beams 70, vertical posts 60, top plate 140, base 145, right wall 120, and left wall 130. The front-to-back beams 90 and the top side-to-side beams 80 are connected to form a top frame 150A. Similarly, the front-to-back beams 90 and the bottom side-to-side beams 70 are connected to form a bottom frame 150B. In some embodiments, the front-to-back beams 90 are permanently connected to the bottom and top side-to-side beams 70, 80. For example, the front-to-back beams 90 are connected to the bottom and top side-to-side beams 70, 80 using permanent connectors such as rivets and welds. In alternative embodiments, the front-to-back beams 90 are removably connected to the bottom and top side-to-side beams 70, 80. For example, the front-to-back beams 90 are connected to the bottom and top side-to-side beams 70, 80 using removable connectors or fasteners, such as nuts and bolts, screws, or the like.

Referring back to FIG. 1, a slider spring apparatus 200A can be attached to the rack device 150 at the bottom frame 150B. Similarly, a slider spring apparatus 200B can be attached to the rack device 150 at the top frame 150A. This is discussed in greater detail with respect to FIGS. 3A and 3B. The slider spring apparatuses 200A and 200B can also be known as mounting devices for the purposes of the present disclosure.

Figure 3A:
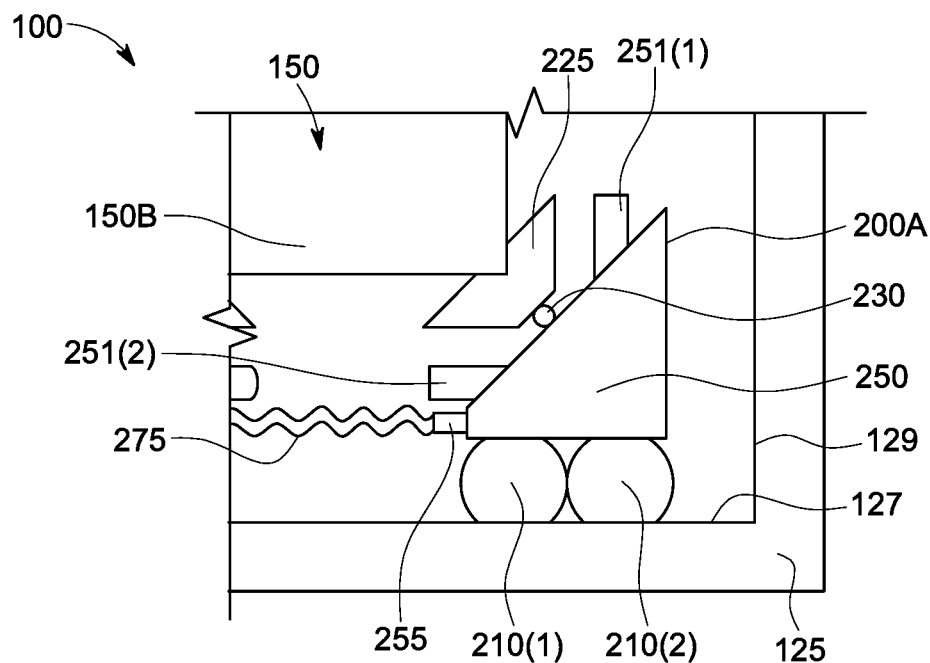
FIG. 3A illustrates a simplified two-dimensional view the slider spring apparatus connected to the rack device of FIG. 2, in accordance with an implementation of the present disclosure.

FIG. 3A illustrates a simplified two-dimensional view of the slider spring apparatus 200A connected to the bottom frame 150B of the rack device 150. FIG. 3A illustrates one corner of the bottom frame 150B. However, it should be understood by one of ordinary skill in the art that the following description is applicable to a duplicate configuration at the opposing corner of the bottom frame 150B. The slider spring apparatus 200A can include a securing element 225. The securing element 225 can include a custom designed apparatus constructed from wood, plastic, or metal materials, or any combinations thereof. Specifically, the securing element 225 can be made of steel or iron. The securing element 225 can be configured to secure a corner or an edge of the bottom frame 150B of the rack device 150. In some examples, the securing element 225 can be bolted to a corner or an edge of the bottom frame 150B. In other embodiments, the securing element 225 can be temporarily secured to a corner or an edge of the bottom frame 150B by rivets, or other temporary means. The securing element 225 can be made from any material constructed to withstand normal forces applied by the rack device 150.

The slider spring apparatuses 200A and 200B can each include two securing elements 225. The securing elements 225 can each secure an opposing portion of the rack device 150. For example, as shown in FIG. 1, the opposing portions can be two opposite corners of the bottom frame 150B of the rack device 150. Alternatively, each securing element 225 can be substantially aligned with its corresponding securing element along an edge of the bottom frame 150B or top frame 150A. This is discussed more in detail with respect to FIG. 3B below.

Referring back to FIG. 3A, the slider spring apparatus 200A can also include a slider 250. Similar to the securing element 225, the slider 250 can include a custom-designed apparatus constructed from wood, plastic, or metal materials. The slider 250 can be designed to have two corresponding surfaces 252(1) and 252(2) which are interconnected by an inclined surface 253 (shown in FIG. 3B). Corresponding surfaces 252(1) and 252(2) can also be connected by a ground surface 254 (shown in FIG. 3B). As slider 250 is a three-dimensional object, a ground surface can additionally be any of the remaining surfaces not labeled as 252(1), 252(2), and 253. The ground surface 254, for example, can hold bearings 210(1) and 210(2). The bearings 210(1) and 210(2) are discussed in further detail with respect to FIG. 3B.

Although a particular shape of slider 250 is shown in, and described with respect to, FIG. 3A and other aspects of the present disclosure, the present disclosure contemplates that there are many viable shapes of slider 250 for the purposes of the present disclosure. For example, although inclined surface 253 lies between two surfaces 252(1) and 252(2), there can be additional surfaces between inclined surface 253 and surfaces 252(1) and 252(2). A person skilled in the art readily understands that any three-dimensional object can be used as a slider 250, so long as the three-dimensional object includes an inclined surface 253 and a ground surface 254, where the ground surface 254 is configured to contact an inner surface 126 or 127. This contact can occur through bearings 210(1) and 210(2), for example.

The slider 250 can include a pivot element 230 on the inclined surface 253. The pivot element 230 can be a bearing, for example. In this embodiment, the pivoting element 230 is pivotably connected to securing element 225 when sliding on the slider 250. In some embodiments, the inclined surface 253 includes a track to guide the pivot element 230 (not pictured). The securing element 225 can be connected to the slider 250 at the pivot element 230. Furthermore, the slider 250 can include stoppers 251(1) and 251(2) on the inclined surface 253. The pivot element 230 can be spring-biased configured to bias the securing element 225 between stoppers 251(1) and 251(2). The stoppers 251(1) and 251(2) are implemented to restrict displacement when vibration exceeds a pre-determined limitation. The pre-determined limitation can be based on the gap between container and rack in which the vibration is allowed. The stoppers 251(1) and 251(2) can be made from the same material as the slider 250. The pivot element 230 can be biased using any other types of connection elements known within the art.

The pivot element 230 can also be configured to slidably connect securing element 225 when sliding on slider 250. The slidable connection can occur via a track on slider 250. Any other mechanical connection can be provided for in order to connect securing element 225 to slider 250 such that securing element 225 can move along slider 250 in response to an applied force.

Figure 3B:
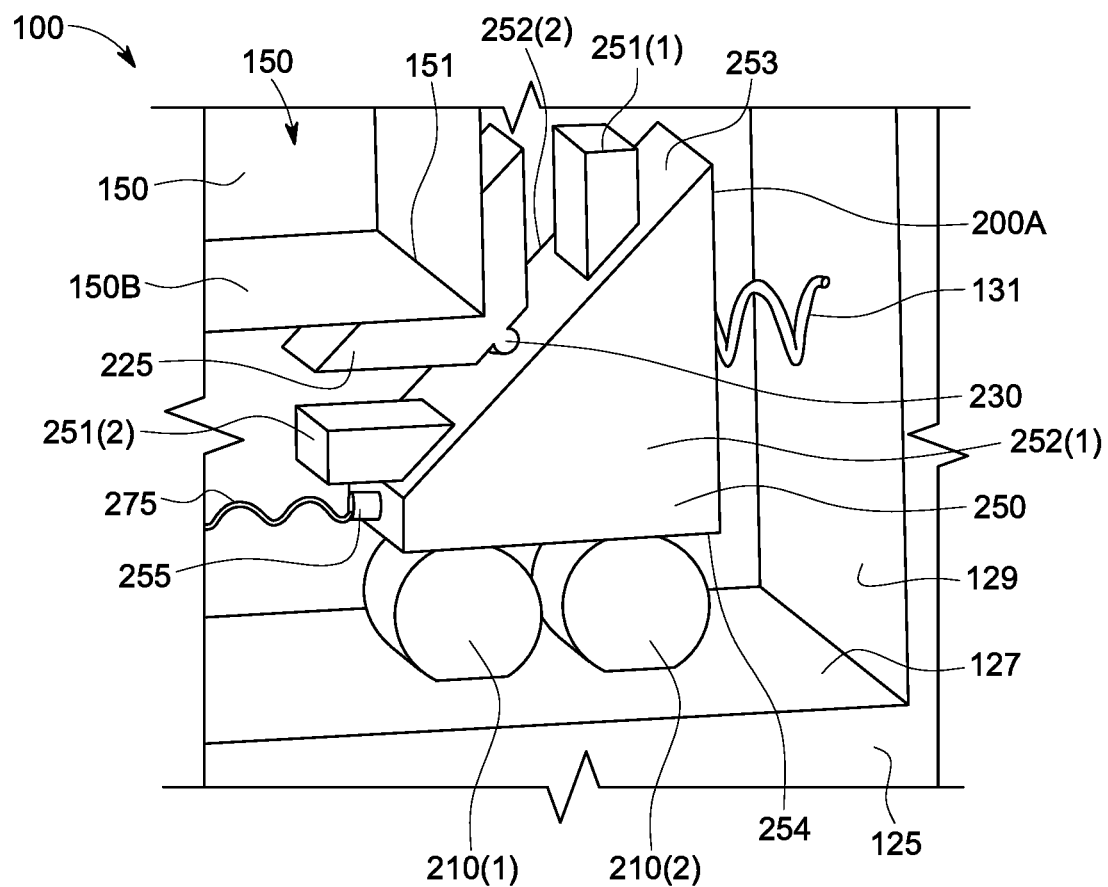
FIG. 3B illustrates a three-dimensional view the slider spring apparatus connected to the rack device of FIG. 2, in accordance with an implementation of the present disclosure.

FIG. 3B illustrates a three-dimensional view of the slider spring apparatus 200A connected to the bottom frame 150B of the rack device 150. The bottom frame 150B of the rack device 150 can have a leading edge 151. The leading edge 151 extends the depth of the rack device 150 into the container 125. The securing element 225 can be configured to secure a portion of the leading edge 151 of the rack device 150. Alternatively, the securing element 225 can be implemented to extend across the length of the leading edge 151, such that it supports the entirety of a length of the leading edge 151 of the bottom frame 150B. Alternatively, the securing element 225 can be implemented to secure the corners or a portion of an edge of the bottom frame 150B of the rack device 150. A corresponding securing element 225 can be aligned, or substantially aligned, either at the corners, near the corners, or along the leading edge 151 of the rack device 150. Although the bottom frame 150B is pictured in FIG. 3B, securing elements 225 can be positioned at the top frame 150A in the same manner as described above with respect to bottom frame 150B. The slider spring apparatus 200A can be secured within the container 125 by an elastic device 131. The elastic device 131 can include a spring device.

The sliders (250 and the opposing slider not shown) can be connected to one another by an elastic device. In some embodiments, the elastic device can include a spring 275 (also shown in FIG. 3A). The slider 250 can include a connector 255 configured to secure the spring 275. In other embodiments, the elastic device can be a device that includes several components.

The slider 250 can be slidably connected to an inner surface 126, 127, 128, and 129 of the container 125. For example, the slider 250 can include bearings 210(1) and 210(2) configured to contact the bottom inner surface 127 of the container 125 (also shown in FIG. 3A). The bearings 210(1) and 210(2) can be inserted within the slider 250 along spinning axles. The bearings 210(1) and 210(2) can roll across the bottom inner surface 127 of the container 125, such that friction is minimal between the slider 250 and the container 125. The bearings 210(1) and 210(2) can be castors, rollers, ball bearings, or other bearing devices configured to reduce friction between the slider 250 and the bottom inner surface 127. In alternative embodiments, the bearings 210(1) and 210(2) can be connected to the bottom inner surface 127 of the container 125 and configured to contact the slider 250. In some embodiments, slider 250 can connect to an inner surface 126, 127, 128, and 129 by sliding directly against the surface, or with some sort of bearing, spherical bearing, or roller. A person skilled in the art readily understands that any mechanism or device can be used within the slider 250 or the inner surface 126, 127, 128, and 129 which allows one mechanism to slide via the other. In alternative embodiments, the slider 250 can connect to the inner surface 126, 127, 128, and 129 by sliding along a track. The slider spring apparatus 200 can disperse vertical force resulting from a combined weight and movement of the rack device 150 to normal force and friction force. This is discussed in greater detail below with respect to FIG. 4.

Figure 4:
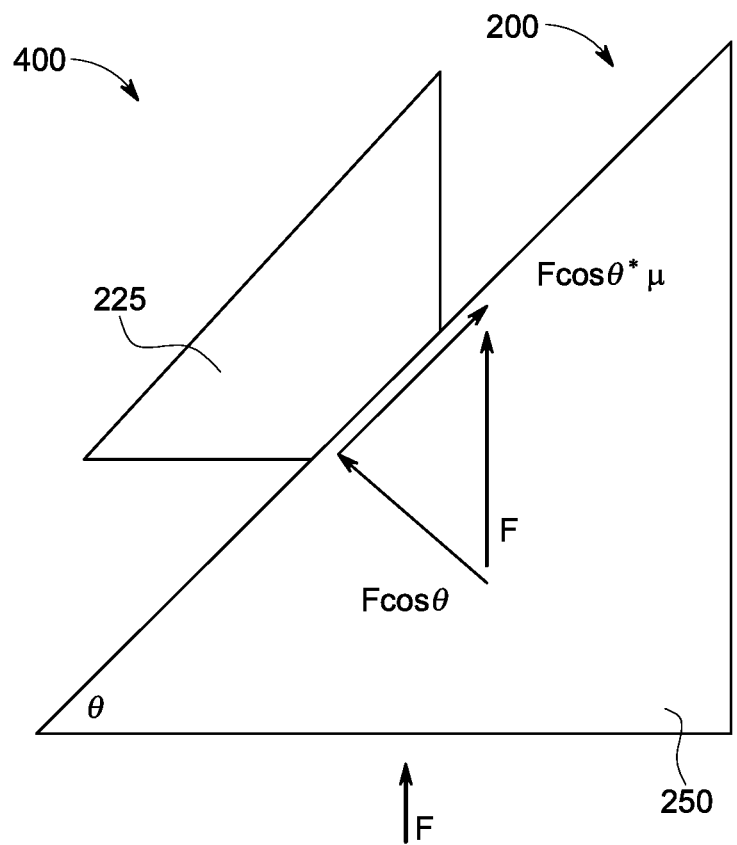
FIG. 4 illustrates a free body diagram of a slider mechanism within the slider spring apparatus of FIG. 3, in accordance with an implementation of the disclosure.

FIG. 4 illustrates a free body diagram 400 of a slider 250 within the slider spring apparatus 200, in accordance with a first embodiment of the disclosure. FIG. 4 shows only certain components of the delivery system 100 in order to more clearly illustrate the forces that act on the slider 250 and the securing element 225. As indicated above, the slider spring apparatus 200 is implemented to reduce vertical and horizontal vibration. When vertical vibration force F is applied on the slider 250 (force F may be a vertical force applied the delivery system 100 and transmitted to the slider spring apparatus 200), the vertical force F is results in a relative displacement between the slider 250 and the securing element 225 with a parallel component F cos Ø*µ and a normal component F cos Ø. In this way, referring now to FIG. 1, the slider spring apparatus 200 reduces the portion of vertical force F applied on the container 125 that is transferred to the rack device 150. Thus, vertical vibration is reduced more efficiently by slider spring apparatus 200. In a substantially similar way, the slider spring apparatus 200 can also reduce the portion of a horizontal force applied on the container 125 that is transferred to the rack device 150. Thus, vertical and horizontal vibration is reduced more efficiently by a slider spring apparatus of the disclosure. It should be understood to one of ordinary skill in the art that the vibration reduction efficiency changes depend on the stiffness of a spring slider spring apparatus (e.g., the spring 275 in FIG. 3), the frequency of vibration, the angle of the slider (e.g., the angle of slider 250 in FIG. 3), and the weight of the rack device being protected.

Figure 5:
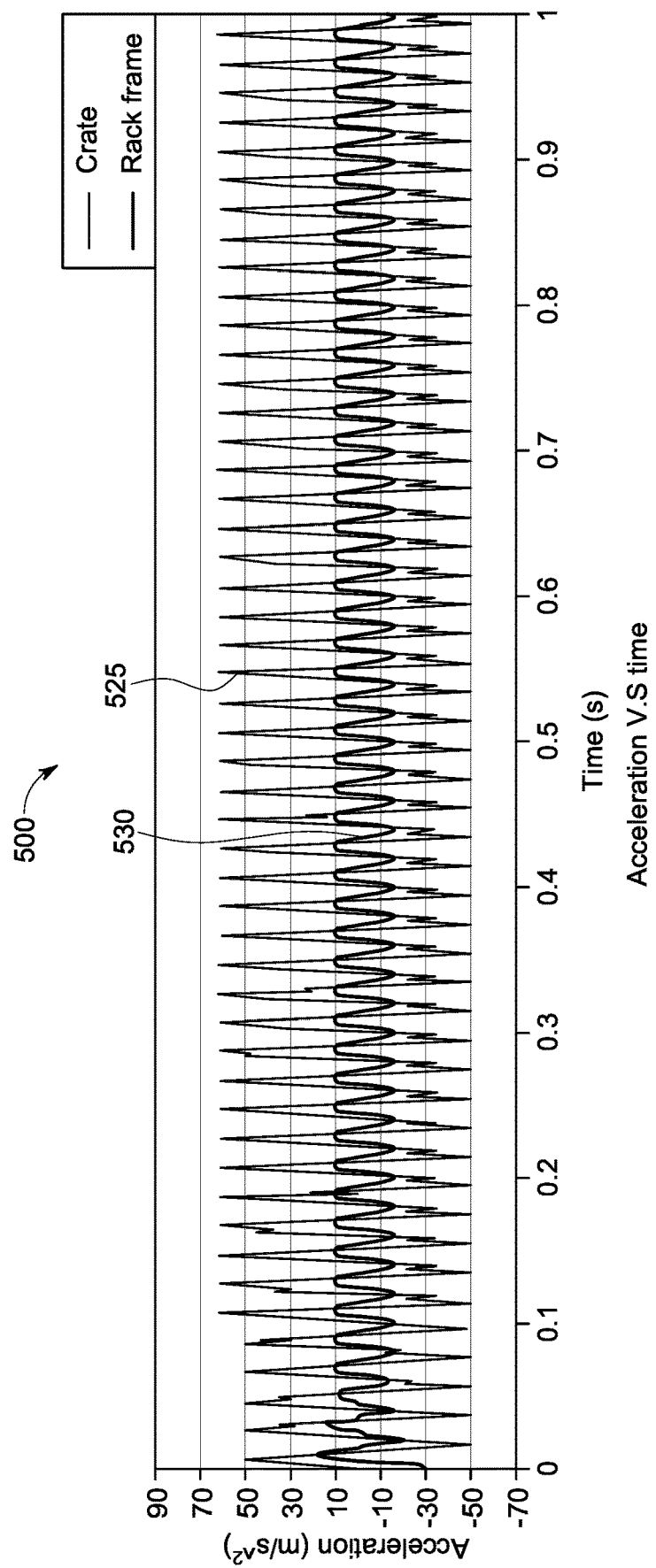
FIG. 5 illustrates a simulation result of vertical vibration using the slider spring apparatus of FIG. 3, in accordance with an implementation of the disclosure.

FIG. 5 illustrates a simulation result 500 of vertical vibration using a slider spring apparatus, in accordance with an embodiment of the disclosure. Similar to FIG. 4, the following description of simulation result 500 is described in detail with reference to an exemplary system with components similar to the components described above for delivery system 100 of FIG. 1. In the present embodiment, the stiffness of the spring in the exemplary system is 200 N/m. The angle of the slider in the exemplary system is 45 degrees. Finally, the frequency of the input displacement is 50 Hz and the amplitude is 50 mm. The acceleration amplitude of the container is reflected in line 525 of FIG. 5. The acceleration amplitude of the rack device is reflected in line 550 of FIG. 5. As shown in FIG. 5, the acceleration amplitude of the container (amplitude of line 525) is at or around 48.94 m/sec². In contrast, the acceleration amplitude of the rack device (amplitude of line 530) is at or at around 9.07 m/sec². Comparing lines 525 and 530, the vibration of the exemplary rack device is reduced by approximately 81% in comparison to the container.

It should be understood by one of ordinary skill in the art that a slider spring apparatus in accordance with the various embodiments can be configured to have a stiffness of the spring that is in a range from 0 to 13 kgf/mm. Additionally, in such configurations, the angle of the slider can be in a range from 0 to 60 degrees. This range is based on a weight of the rack device at about 1,500 kg. In alternative embodiments, the slider spring apparatus can be configured to have a stiffness of the spring that is in a range from 0 to 21.6 kgf/mm, where the angle of the slider can be in a range from 0 to 60 degrees. This range is based on a weight of the rack device at about 2,500 kg. Finally, the slider spring apparatus can be configured to have a stiffness of the spring that is in a range from 0 to 4.33 kgf/mm, where the angle of the slider can be in a range from 0 to 60 degrees. This range is based on a weight of the rack device at about 500 kg. In some embodiments, the stiffness of the spring can be based on the angle of the slider. Furthermore, the angle of the slider can be the weight of the rack device.

While particular embodiments of the present invention have been shown and described, it will be obvious to those skilled in the relevant arts that changes and modifications may be made without departing from the invention in its broader aspects. Therefore, the aim in the appended claims is to cover all such changes and modifications that fall within the true spirit and scope of the invention. The matter set forth in the foregoing description and accompanying drawings is offered by way of illustration only and not as a limitation. The actual scope of the invention is intended to be defined in the following claims when viewed in their proper perspective based on the prior art.

The terminology used herein is for the purpose of describing particular embodiments only and is not intended to limit the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A shock and vibration absorber system for securing a structure in a shipping container during shipment, comprising:
    at least one elastic device; and
    at least one mounting device connected to the at least one elastic device, the at least one mounting device comprising:
        at least two securing elements, wherein each securing element of the at least one mounting device is configured to secure an opposing portion of the structure; and
        at least two sliders,
            wherein each slider has at least two corresponding surfaces which are interconnected by at least one inclined surface and at least one ground surface,
            wherein the at least one inclined surface is facing an opposing slider and one of the at least two securing elements is slidably connected to the at least one inclined surface,
            wherein each slider is arranged to move in response to an applied force, and
            wherein the at least one ground surface is configured to slidably connect to an inner wall of the shipping container.

2. The shock and vibration absorber system of claim 1, wherein each of the at least two securing elements is positioned between two stoppers on the inclined surface to restrict movement of the securing element in response to an applied force.

3. The shock and vibration absorber system of claim 1, wherein each of the at least two securing elements further comprises at least one bearing configured to connect one of the inclined surfaces to a corresponding securing element.

4. The shock and vibration absorber system of claim 1, wherein each of the ground surfaces further comprises at least one bearing, wherein each at least one bearing is configured to connect the at least two corresponding surfaces of each slider to the inner wall.

5. The shock and vibration absorber system of claim 1, wherein a first end of the elastic device is connected to a first of the at least two sliders and a second end of the elastic device is connected to a second of the at least two sliders.

6. The shock and vibration absorber system of claim 1, wherein a first end of the elastic device is connected to a first of the at least two sliders, and a second end of the elastic device is connected to the inner wall.

7. The shock and vibration absorber system of claim 1, wherein the at least one mounting device comprises a first mounting device connected to a top frame of the container and a second mounting device connected to a bottom frame of the container.

8. The shock and vibration absorber system of claim 1, wherein the opposing portions are opposing edges or corners of the structure and wherein the at least two securing elements are substantially aligned with each other along the opposing portions.

9. The shock and vibration absorber system of claim 1, wherein the elastic device comprises a spring device.

10. The shock and vibration absorber system of claim 1, wherein each slider is connected to a corresponding securing element via a spring-biased pivot element.

11. A delivery system comprising:
a container structure comprising a top inner surface and a bottom inner surface;
a device comprising a top frame and a bottom frame; and
at least two mounting devices, wherein each mounting device comprises:
at least two securing elements, wherein each securing element of the at least one mounting device is configured to secure an opposing portion of the device; and
at least two sliders,
wherein each slider has at least two corresponding surfaces which are interconnected by an inclined surface facing an opposing slider, wherein one of the at least two securing elements is slidably connected to the at least one inclined surface,
wherein each slider is arranged to move in response to an applied force, and
wherein each slider is configured to slidably connect to either the top inner surface or the bottom inner surface of the container structure.

12. The delivery system of claim 11, wherein each of the at least two securing elements is positioned between two stoppers on the inclined surface to restrict displacement of the device when vibration exceeds a predetermined threshold.

13. The delivery system of claim 11, wherein one of the at least two mounting devices is connected to the top frame of the device, and a second one of the at least two mounting devices is connected to the bottom frame of the device.

14. The delivery system of claim 11, wherein the opposing portions are opposing edges or corners of the structure and wherein the at least two securing elements are substantially aligned with each other along the opposing portions.

15. The delivery system of claim 11, wherein each slider is connected to a corresponding securing element at a spring-biased pivot element.

16. The delivery system of claim 11, wherein the elastic device comprises a spring device.

17. The delivery system of claim 11, wherein each mounting device further comprises a first bearing configured to connect one of the inclined surfaces to a corresponding securing element.

18. The delivery system of claim 11, wherein each mounting device further comprises two bearings, wherein each bearing is configured to connect the at least two corresponding surfaces of each slider.

* * * * *